(12) United States Patent
Jo et al.

(10) Patent No.: US 12,101,084 B2
(45) Date of Patent: Sep. 24, 2024

(54) DRIVER CIRCUIT

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 23 days.

(21) Appl. No.: 17/782,912

(22) PCT Filed: Dec. 12, 2019

(86) PCT No.: PCT/JP2019/048635
§ 371 (c)(1),
(2) Date: Jun. 6, 2022

(87) PCT Pub. No.: WO2021/117181
PCT Pub. Date: Jun. 17, 2021

(65) Prior Publication Data
US 2023/0018906 A1    Jan. 19, 2023

(51) Int. Cl.
*H03K 17/00*  (2006.01)
*H03K 17/687* (2006.01)

(52) U.S. Cl.
CPC ............... *H03K 17/6871* (2013.01)

(58) Field of Classification Search
CPC ........ H03K 5/249; H03K 5/2481; H03K 5/24; H03F 3/45179; H03F 17/6871
See application file for complete search history.

(56) References Cited

U.S. PATENT DOCUMENTS

| | | | |
|---|---|---|---|
| 5,642,077 A  * | 6/1997 | Nagaraj | H03F 3/45766 330/253 |
| 2005/0162194 A1* | 7/2005 | Kim | H03H 11/04 327/65 |

(Continued)

FOREIGN PATENT DOCUMENTS

| JP | 2003243951 A | 8/2003 |
|---|---|---|
| JP | 2007158084 A | 6/2007 |

OTHER PUBLICATIONS

Nakano et al., "A 2.25-mW/Gb/s 80-Gb/s-PAM4 Linear Driver with a Single Supply using Stacked Current-Mode Architecture in 65-nm CMOS," 2017 Symposium on VLSI Circuits Digest of Technical Papers, pp. C322-C323, Jun. 5, 2017, total 2 pages.

*Primary Examiner* — Tuan T Lam
(74) *Attorney, Agent, or Firm* — Slater Matsil, LLP

(57) ABSTRACT

A driver circuit includes a differential pair of transistors that amplify differential input signals and output the amplified differential input signals from signal output terminals, a current source that supplies a constant current to the differential pair of transistors, a switch that stops the current supply from the current source to the differential pair of transistors during a shutdown mode period, capacitors each having one end connected to the ground, a switch that connects the capacitor to the signal output terminal during the shutdown mode period and disconnects the capacitor from the signal output terminal during an amplification mode period, and a switch that connects the capacitor to the signal output terminal during the shutdown mode period and disconnects the capacitor from the signal output terminal during the amplification mode period.

14 Claims, 8 Drawing Sheets

(56) References Cited

U.S. PATENT DOCUMENTS

| | | | |
|---|---|---|---|
| 2007/0279130 A1* | 12/2007 | Furuta | H03F 3/45183 330/253 |
| 2013/0044017 A1* | 2/2013 | Matsuzawa | H03M 1/165 330/254 |
| 2018/0183394 A1* | 6/2018 | Liu | H03F 3/72 |

* cited by examiner

Prior Art

Prior Art

DRIVER CIRCUIT

CROSS-REFERENCE TO RELATED APPLICATIONS

This application is a national phase entry of PCT Application No. PCT/JP2019/048635, filed on Dec. 12, 2019, which application is hereby incorporated herein by reference.

TECHNICAL FIELD

Embodiments of the present invention relates to a driver circuit having a shutdown function.

BACKGROUND

A driver circuit used in an optical transmitter for optical communication is used to drive an optical modulator in the optical transmitter. The driver circuit functions to amplify an amplitude intensity of an electric signal to be transmitted to a level that allows the optical modulator to be driven (see NPL 1).

The driver circuit is required to have, in addition to a normal amplification mode in which an input signal is amplified, a shutdown mode in which, when the input signal has abnormality, the signal is not output. As a typical method of implementing the shutdown mode, there is a method in which a gate terminal of a current source transistor Q3 is provided with a switch SW1, as illustrated in FIG. 7.

In the normal amplification mode, the switch SW1 is in an ON state, a bias voltage Vb is applied to the gate terminal of the current source transistor Q3, and a current flows in a differential pair of transistors Q1 and Q2. Meanwhile, in the shutdown mode, a shutdown signal SD is input to the switch SW1 to turn OFF the switch SW1, and the application of the bias voltage to the current source transistor Q3 is stopped. As a result, the current no longer flows in the differential pair of transistors Q1 and Q2, and the transistors Q1 and Q2 no longer operate, and consequently no signal is output from signal output terminals 3 and 4.

Thus, the configuration illustrated in FIG. 7 allows the shutdown mode in which no signal is output to be implemented.

However, the transistors Q1 and Q2 included in the differential pair have parasitic capacitances C1 and C2, as illustrated in FIG. 8. This results in a problem that, even when the transistors Q1 and Q2 do not operate, input signals Vin_P and Vin_N leak to the signal output terminals 3 and 4 via the parasitic capacitances C1 and C2. As a frequency is higher, an impedance of each of the parasitic capacitances C1 and C2 is lower. Consequently, the conventional driver circuit has a problem that input/output isolation during the shutdown mode period is poor particularly at higher frequencies.

CITATION LIST

Non Patent Literature

NPL 1 Shinsuke Nakano, et al., "A 2.25-mW/Gb/s 80-Gb/s-PAM4 linear driver with a single supply using stacked current-mode architecture in 65-nm CMOS", 2017 Symposium on VLSI Circuits, IEEE, 2017

SUMMARY

Technical Problem

The embodiments of the present invention has been achieved in order to solve the problem described above, and an object thereof is to provide a driver circuit capable of achieving high input/output isolation during a shutdown mode period.

Means for Solving the Problem

A driver circuit of the present invention includes: a differential pair of transistors configured to amplify differential input signals and output the amplified differential input signals from a pair of signal output terminals; a current source configured to supply a constant current to the differential pair of transistors; a first switch configured to stop the current supply from the current source to the differential pair of transistors during a shutdown mode period; a first capacitor and a second capacitor each having one end connected to the ground; a second switch configured to connect another end of the first capacitor to the signal output terminal on a positive phase side during the shutdown mode period and disconnect the first capacitor from the signal output terminal on the positive phase side during a normal amplification mode period; and a third switch configured to connect another end of the second capacitor to the signal output terminal on a negative phase side during the shutdown mode period and disconnect the second capacitor from the signal output terminal on the negative phase side during the amplification mode period.

Alternatively, the driver circuit of the present invention includes: a differential pair of transistors configured to amplify differential input signals and output the amplified differential input signals from a pair of signal output terminals; a current source configured to supply a constant current to the differential pair of transistors; a switch configured to stop the current supply from the current source to the differential pair of transistors during a shutdown mode period; a variable resistor made of a MOS transistor inserted between the pair of signal output terminals; and a first control circuit configured to set a control voltage to be applied to a gate terminal of the MOS transistor in response to a gain control signal for setting a gain of the driver circuit to an intended value during a normal amplification mode period and set the control voltage higher than a power source voltage of the driver circuit during the shutdown mode period.

Still alternatively, the driver circuit of the present invention includes: a differential pair of transistors configured to amplify differential input signals and output the amplified differential input signals from a pair of signal output terminals; a current source configured to supply a constant current to the differential pair of transistors; a first switch configured to stop the current supply from the current source to the differential pair of transistors during a shutdown mode period; a first capacitor and a second capacitor each having one end connected to the ground; a second switch configured to connect another end of the first capacitor to the signal output terminal on a positive phase side during the shutdown mode period and disconnect the first capacitor from the signal output terminal on the positive phase side during a normal amplification mode period; a third switch configured to connect another end of the second capacitor to the signal output terminal on a negative phase side during the shutdown mode period and disconnect the second capacitor from the signal output terminal on the negative phase side during the amplification mode period; a variable resistor made of a MOS transistor inserted between the pair of signal output terminals; and a first control circuit configured to set a control voltage to be applied to a gate terminal of the MOS transistor in response to a gain control signal for setting a gain of the driver circuit to an intended value during the normal amplification mode period and set the control voltage higher than a power source voltage of the driver circuit during the shutdown mode period.

Effects of the Invention

According to embodiments of the present invention, it is possible to achieve the high input/output isolation during the shutdown mode period.

DETAILED DESCRIPTION OF ILLUSTRATIVE EMBODIMENTS

First Embodiment

Figure 1:
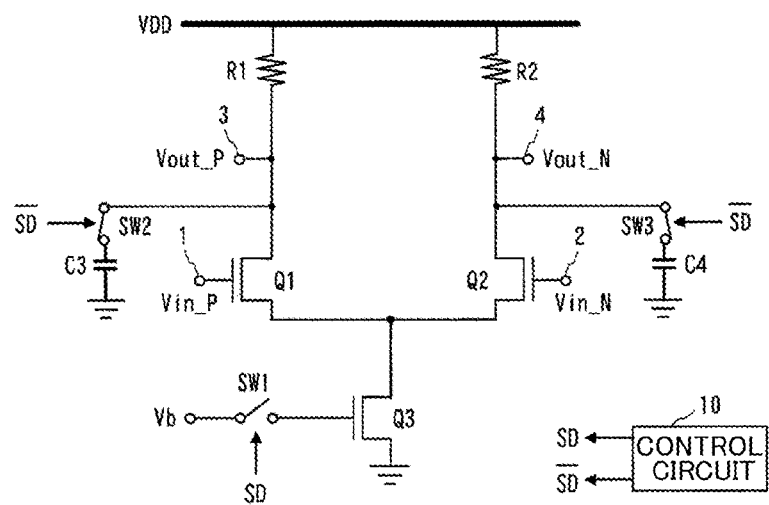
FIG. 1 is a circuit diagram illustrating a configuration of a driver circuit according to a first embodiment of the present invention.

Referring to the drawings, a description will be given of embodiments of the present invention. FIG. 1 is a circuit diagram illustrating a configuration of a driver circuit according to the first embodiment of the present invention. The driver circuit in the present embodiment includes NMOS transistors Q1 and Q2 (a differential pair of transistors) having respective gate terminals connected to signal input terminals 1 and 2 and respective drain terminals connected to signal output terminals 3 and 4, an NMOS transistor Q3 having a drain terminal connected to respective source terminals of the NMOS transistors Q1 and Q2 and a source terminal connected to the ground to serve as a current source that supplies a constant current to each of the NMOS transistors Q1 and Q2, load resistors R1 and R2 each having one end connected to a voltage voltage VDD and another end connected to the signal output terminals 3 and 4, a switch SW1 that is ON during a normal amplification mode period to apply a bias voltage Vb to a gate terminal of the NMOS transistor Q3 and is OFF during a shutdown mode period to stop the application of the bias voltage to the gate terminal of the NMOS transistor Q3, capacitors C3 and C4 each having one end connected to the ground, a switch SW2 that is ON during the shutdown mode period to connect another end of the capacitor C3 to the signal output terminal 3 on a positive phase side and is OFF during the amplification mode period to disconnect the capacitor C3 from the signal output terminal 3, a switch SW3 that is ON during the shutdown mode period to connect another end of the capacitor C4 to the signal output terminal 4 on a negative phase side and is OFF during the amplification mode period to disconnect the capacitor C4 from the signal output terminal 4, and a control circuit 10 that controls the switches SW1 to SW3.

In the present embodiment, as illustrated in FIG. 1, the capacitors C3 and C4 and the switches SW2 and SW3 are added to a conventional driver circuit to improve input/output isolation at higher frequencies during the shutdown mode period. Operations and effects of the present embodiment will be descried below.

Similarly to the conventional driver circuit, the driver circuit in the present embodiment has two states in an amplification mode and a shutdown mode.

During the shutdown mode period, a shutdown signal SD is input as a control input to the switch SW1, while an inversion signal bar SD of the shutdown signal SD is input as a control input to the switches SW2 and SW3 to each of the switches SW2 and SW3.

Each of the shutdown signal SD and the inversion signal bar SD is a signal indicating entrance into the shutdown mode. The inversion signal is used as the signal to be input to each of the switches SW2 and SW3 such that the ON/OFF states of the switches SW2 and SW3 are reverse to the ON/OFF states of the switch SW1, as will be described later. The shutdown signal SD and the inversion signal bar SD are generated by the control circuit 10. When, e.g., a signal reporting abnormality is input to the control circuit 10 from the outside, the control circuit 10 outputs the shutdown signal SD and the inversion signal bar SD.

In the same manner as in the conventional driver circuit, the shutdown signal SD is input to the switch SW1 to turn OFF the switch SW1 and stop the application of the bias voltage to the NMOS transistor Q3. As a result, the current supply from the NMOS transistor Q3 serving as the current source to each of the NMOS transistors Q1 and Q2 is stopped, and consequently the NMOS transistors Q1 and Q2 no longer operate, and no signal is output from the signal output terminals 3 and 4.

Meanwhile, the inversion signal bar SD of the shutdown signal SD is input to the switches SW2 and SW3 to turn ON the switches SW2 and SW3 and connect the capacitors C3 and C4 to the signal output terminals 3 and 4. As a frequency is higher, an impedance of each of the capacitors C3 and C4 is lower. Consequently, RF signals input from the signal input terminals 1 and 2 flow to the ground through the capacitors C3 and C4 to attenuate.

Meanwhile, during the amplification mode period, the shutdown signal SD is no longer input to the switch SW1 (the inversion signal of the shutdown signal SD from the control circuit 10 is input thereto), and consequently the switch SW1 is turned ON. In addition, the signal bar SD is no longer input to each of the switches SW2 and SW3 (a signal on the same level as that of the shutdown signal SD is input thereto from the control circuit 10), and consequently the switches SW2 and SW3 are turned OFF.

As a result of the turning ON of the switch SW1, the bias voltage Vb is applied to the gate terminal of the NMOS transistor Q3, and consequently a current flows in each of the NMOS transistors Q1 and Q2. The driver circuit amplifies differential input signals Vin_P and Vin_N input to the signal input terminals 1 and 2 and outputs differential output signals Vout_P and Vout_N from the signal output terminals 3 and 4.

In addition, as a result of the turning OFF of the switches SW2 and SW3, the capacitors C3 and C4 are disconnected from the signal output terminals 3 and 4. As a result, there is substantially no band deterioration due to the provision of the capacitors C3 and C4.

Figure 2:
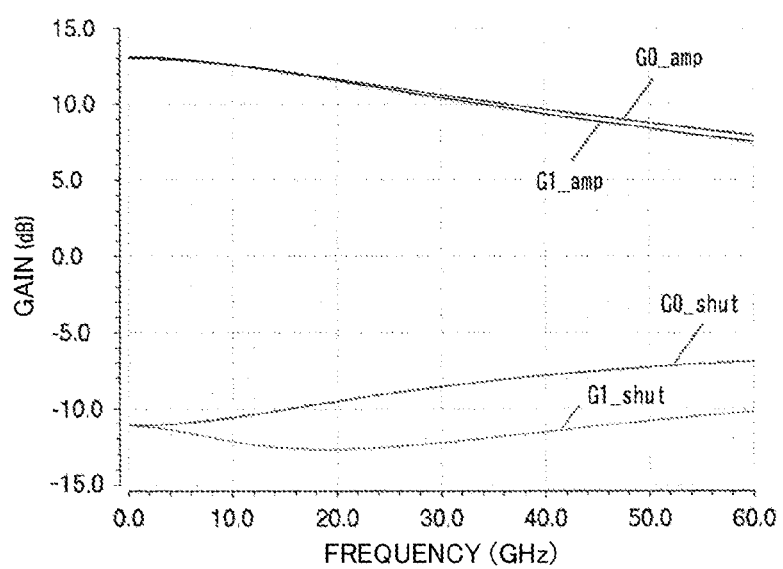
FIG. 2 is a diagram illustrating a result of simulation of respective gains of a conventional driver circuit and the driver circuit according to the first embodiment of the present invention.
Figure 7:
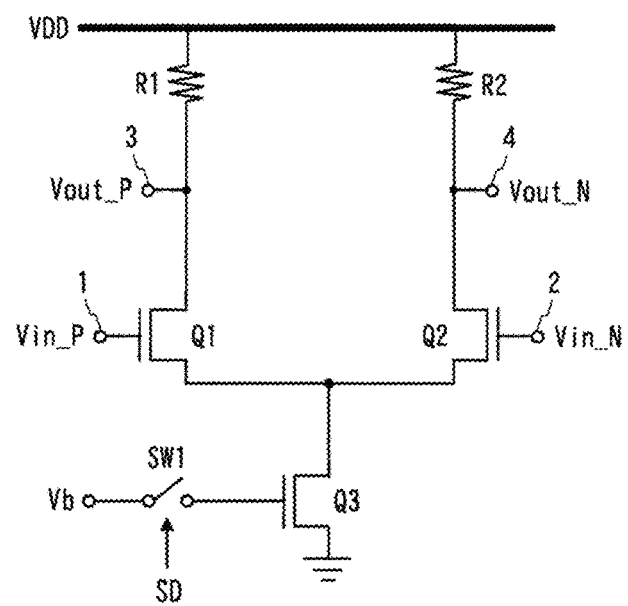
FIG. 7 is a circuit diagram illustrating a configuration of the conventional driver circuit.
Figure 8:
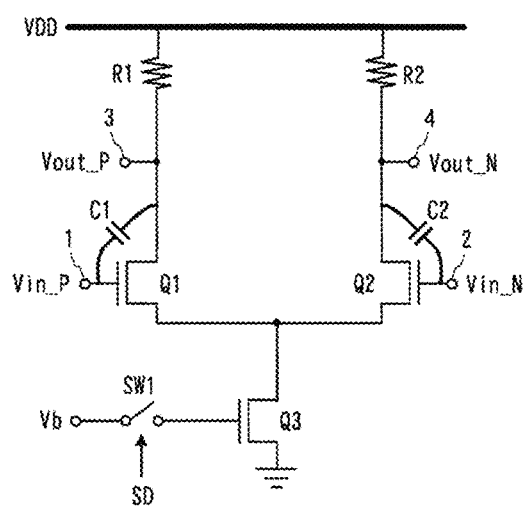
FIG. 8 is a diagram illustrating a problem of the conventional driver circuit.

FIG. 2 is a diagram illustrating a result of simulation of respective gains in a conventional embodiment and the present embodiment. As the conventional driver circuit, a configuration illustrated in FIG. 7 is used. In FIG. 2, G0_amp represents the gain of the conventional driver circuit during the amplification mode period and G1_amp represents the gain of the driver circuit in the present embodiment during the amplification mode period. Meanwhile, G0_shut represents the gain of the conventional driver circuit during the shutdown mode period and G1_shut represents the gain of the driver circuit in the present embodiment during the shutdown mode period.

According to FIG. 2, the driver circuit in the present embodiment has the gain and a band characteristic during the amplification mode period which are substantially the same as those of the conventional driver circuit, but has the gain on a higher frequency side during the shutdown mode period which is significantly lower than that of the conventional driver circuit. This shows that the input/output isolation characteristic has been improved.

Second Embodiment

Figure 3:
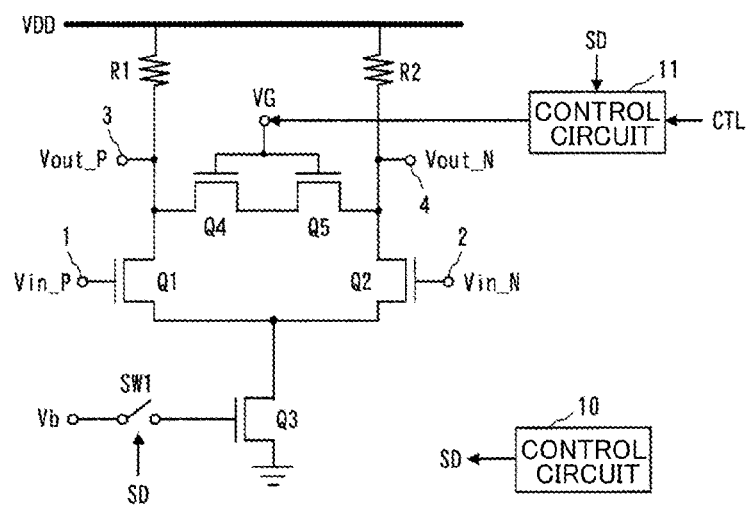
FIG. 3 is a circuit diagram illustrating a configuration of a driver circuit according to a second embodiment of the present invention.

Existing driver circuits include a driver circuit having a variable gain function. The present embodiment shows an example which extensively uses the variable gain function to improve the input/output isolation characteristic during the shutdown mode period. FIG. 3 is a circuit diagram illustrating a configuration of a driver circuit in the present embodiment.

The driver circuit in the present embodiment includes the NMOS transistors Q1 to Q3, the load resistors R1 and R2, an NMOS transistor Q4 having a source terminal connected to the signal output terminal 3, an NMOS transistor Q5 having a drain terminal connected to a drain terminal of the NMOS transistor Q4 and having a source terminal connected to the signal output terminal 4, the control circuit 10, and a control circuit 11 that sets a control voltage VG to be applied to respective gate terminals of the NMOS transistors Q4 and Q5 in response to a gain control signal CTL for setting the gain of the driver circuit to a predetermined value during the amplification mode period and sets the control voltage VG higher than the power source voltage VDD of the driver circuit during the shutdown mode period.

Each of the NMOS transistors Q4 and Q5 functions as a variable resistor. As a result of increasing the control voltage VG applied to the gate terminal of each of the NMOS transistors Q4 and Q5, a value of a drain-source resistance in each of the NMOS transistors Q4 and Q5 decreases, and the differential output signals Vout_P and Vout_N output from the signal output terminals 3 and 4 attenuate.

Conventionally, the variable gain function using such a variable resistor is used only during the amplification mode period. A range of the control voltage VG during the amplification mode period is required to be set to fall within a range of VCM_op to VCM_op+Vbreak in consideration of a maximum voltage (breakdown voltage) Vbreak that can be applied between the gate terminal and the source terminal of each of the NMOS transistors Q4 and Q5. VCM_op represents a common voltage at the signal output terminals 3 and 4 when the driver circuit operates in the amplification mode. When the control voltage VG is set to VCM_op+Vbreak, an ON resistance of each of the NMOS transistors Q4 and Q5 is lowest, and the differential output signals Vout_P and Vout_N maximally attenuate.

Meanwhile, as described in the first embodiment, when the shutdown signal SD is output from the control circuit 10 to turn OFF the switch SW1, no current flows in the signal output terminals 3 and 4, and consequently the common voltage VCM_op increases to the power source voltage VDD. Even when the control voltage VG is set to the VCM_op+Vbreak in this state, a state where the ON resistance of each of the NMOS transistors Q4 and Q5 is lowest is not reached.

Accordingly, in the present embodiment, during the shutdown mode period, the control voltage VG is set higher than the power source voltage VDD of the driver circuit. Specifically, when the shutdown signal SD is input thereto, the control circuit 11 sets the control voltage VG to a voltage VDD+Vbreak obtained by adding the breakdown voltage Vbreak of each of the NMOS transistors Q4 and Q5 to the power source voltage VDD. As a result, the ON resistance of each of the NMOS transistors Q4 and Q5 during the shutdown mode period has a lowest value, and it is possible to achieve the input/output isolation higher than that in the conventional driver circuit illustrated in FIG. 7.

Figure 4:
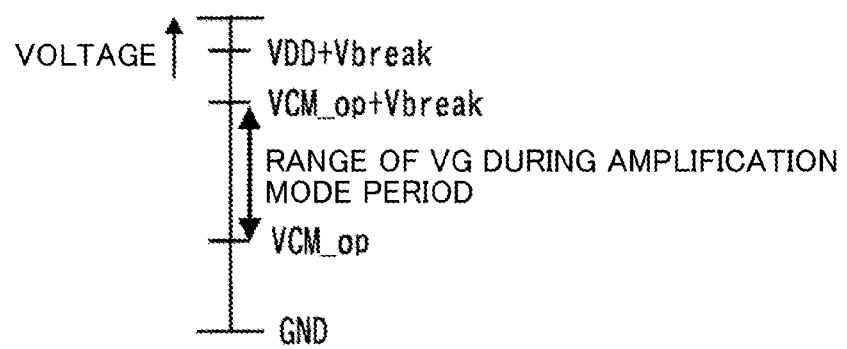
FIG. 4 is a diagram illustrating a magnitude relationship between control voltages during an amplification mode period and a shutdown mode period in the second embodiment of the present invention.

Note that, during the amplification mode period, the shutdown signal SD is no longer input to the control circuit 11 (the inversion signal of the shutdown signal SD is input thereto from the control circuit 10). At this time, the control circuit 11 outputs the control voltage VG having a value corresponding to the gain control signal CTL for setting the gain of the driver circuit to an intended value. As described above, the range of the control voltage VG during the amplification mode period is given by VCM_op to VCM_op+Vbreak. FIG. 4 illustrates a magnitude relationship between the control voltages VG described above.

Figure 5:
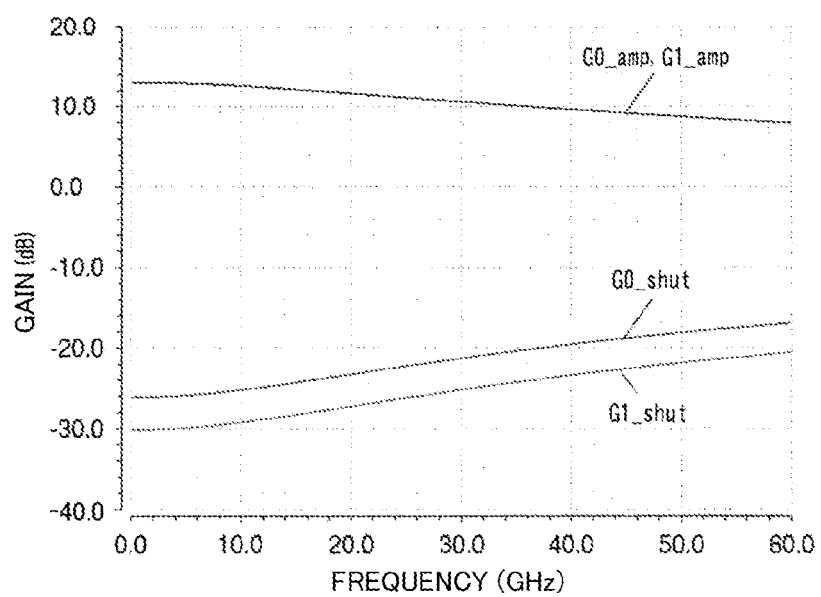
FIG. 5 is a diagram illustrating a result of simulation of respective gains of the conventional driver circuit and the driver circuit according to the second embodiment of the present invention.

FIG. 5 is a diagram illustrating a result of simulation of respective gains in the conventional embodiment and the present embodiment. As the conventional driver circuit, a configuration obtained by setting the control voltage VG to VCM_op+Vbreak during the shutdown mode period in the configuration illustrated in FIG. 3 is used. In the same manner as in FIG. 2, G0_amp in FIG. 5 represents the gain of the conventional driver circuit during the amplification mode period and G1_amp represents the gain of the driver circuit in the present embodiment during the amplification mode period. Meanwhile, G0_shut represents the gain of the conventional driver circuit during the shutdown mode period and G1_shut represents the gain of the driver circuit in the present embodiment during the shutdown mode period.

From FIG. 5, it can be seen that the driver circuit in the present embodiment has an improved input/output isolation characteristic compared to an input/output isolation characteristic of the conventional driver circuit in which, during the shutdown mode period, the control voltage VG is set to VCM_op+Vbreak.

Third Embodiment

By combining the first embodiment and second embodiment with each other, it is possible to further improve the input/output isolation characteristic during the shutdown mode period.

Figure 6:
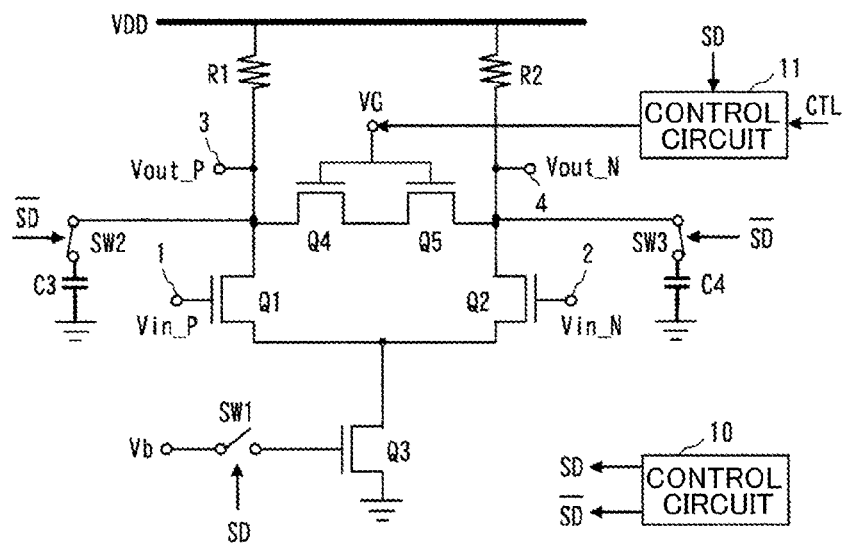
FIG. 6 is a circuit diagram illustrating a configuration of a driver circuit according to a third embodiment of the present invention.

FIG. 6 illustrates a configuration obtained by combining the first embodiment and the second embodiment with each other. An operation of each of the components in FIG. 6 is as described in the first and second embodiments.

INDUSTRIAL APPLICABILITY

The present invention is applicable to an optical transmitter or the like.

REFERENCE SIGNS LIST

Q1 to Q5 NMOS transistor
R1, R2 Load resistor
C3, C4 Capacitor
SW1 to SW3 Switch
10, 11 Control circuit

The invention claimed is:

1. A driver circuit comprising:
    a differential pair of transistors configured to amplify differential input signals and output the amplified differential input signals from a pair of signal output terminals;
    a current source configured to supply a constant current to the differential pair of transistors;
    a first switch configured to stop the current supply from the current source to the differential pair of transistors during a shutdown mode period, a shutdown signal being a control input to the first switch;
    a first capacitor and a second capacitor each having one end connected to the ground;
    a second switch configured to connect another end of the first capacitor to the signal output terminal on a positive phase side during the shutdown mode period and disconnect the first capacitor from the signal output terminal on the positive phase side during an amplification mode period, an inversion of the shutdown signal being a control input to the second switch; and
    a third switch configured to connect another end of the second capacitor to the signal output terminal on a negative phase side during the shutdown mode period and disconnect the second capacitor from the signal output terminal on the negative phase side during the amplification mode period, the inversion of the shutdown signal being a control input to the second switch.

2. The driver circuit according to claim 1, further comprising:
    a first control circuit configured to perform control such that the first switch is ON and the second and third switches are OFF during the amplification mode period and that the first switch is OFF and the second and third switches are ON during the shutdown mode period.

3. The driver circuit according to claim 2, further comprising:
    a variable resistor made of a MOS transistor inserted between the pair of signal output terminals.

4. The driver circuit according to claim 3, further comprising:
    a second control circuit configured to set a control voltage to be applied to a gate terminal of the MOS transistor in response to a gain control signal for setting a gain of the driver circuit to an intended value during the amplification mode period and set the control voltage higher than a power source voltage of the driver circuit during the shutdown mode period.

5. A driver circuit comprising:
    a differential pair of transistors configured to amplify differential input signals and output the amplified differential input signals from a pair of signal output terminals;
    a current source configured to supply a constant current to the differential pair of transistors;
    a first switch configured to stop the current supply from the current source to the differential pair of transistors during a shutdown mode period;
    a first capacitor and a second capacitor each having one end connected to the ground;
    a second switch configured to connect another end of the first capacitor to the signal output terminal on a positive phase side during the shutdown mode period and disconnect the first capacitor from the signal output terminal on the positive phase side during an amplification mode period;
    a third switch configured to connect another end of the second capacitor to the signal output terminal on a negative phase side during the shutdown mode period and disconnect the second capacitor from the signal output terminal on the negative phase side during the amplification mode period;
    a variable resistor made of a MOS transistor inserted between the pair of signal output terminals;
    a first control circuit configured to set a control voltage to be applied to a gate terminal of the MOS transistor in response to a gain control signal for setting a gain of the driver circuit to an intended value during the amplification mode period and set the control voltage higher than a power source voltage of the driver circuit during the shutdown mode period; and
    a second control circuit configured to perform control such that the ON/OFF states of the second and third switches are reverse to the ON/OFF state of the first switch.

6. The driver circuit according to claim 5, wherein the second control circuit is further configured to perform control such that the first switch is ON and the second and third switches are ON during the amplification mode period and that the first switch is OFF and the second and third switches are ON during the shutdown mode period.

7. The driver circuit according to claim 5, wherein
    the MOS transistor includes:
    a first MOS transistor having a source terminal connected to the signal output terminal on the positive phase side; and
    a second MOS transistor having a drain terminal connected to a drain terminal of the first MOS transistor and having a source terminal connected to the signal output terminal on the negative phase side, and
    the first control circuit uses, as the control voltage during the shutdown mode period, a voltage obtained by adding the power source voltage of the driver circuit to a maximum voltage that can be applied between a gate terminal and the source terminal of each of the first and second MOS transistors.

8. A driver circuit comprising:
    a differential pair of transistors configured to amplify differential input signals and output the amplified differential input signals from a pair of signal output terminals;

a current source configured to supply a constant current to the differential pair of transistors;

a first switch configured to couple the current source to the differential pair of transistors during an amplification mode period and to decouple the current source from the differential pair of transistors during a shutdown mode period;

a first capacitor and a second capacitor each having one end connected to a ground terminal;

a second switch configured to connect another end of the first capacitor to the signal output terminal on a positive phase side during the shutdown mode period and disconnect the first capacitor from the signal output terminal on the positive phase side during the amplification mode period;

a third switch configured to connect another end of the second capacitor to the signal output terminal on a negative phase side during the shutdown mode period and disconnect the second capacitor from the signal output terminal on the negative phase side during the amplification mode period;

a variable resistor comprising a MOS transistor coupled between the pair of signal output terminals; and a control circuit configured to:
  control the first, second, and third switches such that the first switch couples the current source to the differential pair during the amplification mode period while the second and third switches decouple the capacitors from the output terminals, and such that the first switch decouples the current source from the differential pair during the shutdown mode period while the second and third switches couple the capacitors to the output terminals; and
  set a control voltage applied to a gate terminal of the MOS transistor based on a gain control signal to set a gain of the driver circuit during the amplification mode period, and to set the control voltage higher than a power supply voltage of the driver circuit during the shutdown mode period.

9. The driver circuit of claim 8, wherein the control circuit is further configured to:
  control the first, second and third switches such that the ON/OFF states of the second and third switches are reverse to the ON/OFF state of the first switch.

10. The driver circuit of claim 8, further comprising:
  a first resistor coupled between a power supply voltage and the signal output terminal on the positive phase side; and
  a second resistor coupled between the power supply voltage and the signal output terminal on the negative phase side.

11. The driver circuit of claim 10, wherein the first and second resistors have equal resistance values.

12. The driver circuit of claim 8, wherein the first and second capacitors have equal capacitance values.

13. The driver circuit of claim 8, wherein the differential pair of transistors comprises:
  a first transistor having a gate terminal coupled to a first differential input signal, a source terminal coupled to the current source, and a drain terminal coupled to the signal output terminal on the positive phase side; and
  a second transistor having a gate terminal coupled to a second differential input signal, a source terminal coupled to the current source, and a drain terminal coupled to the signal output terminal on the negative phase side.

14. The driver circuit of claim 8, wherein the control circuit comprises:
  a first logic circuit configured to receive a shutdown control signal and in response generate switch control signals for the first, second and third switches; and
  a second logic circuit configured to receive the gain control signal and in response generate the control voltage for the gate terminal of the MOS transistor.

* * * * *